United States Patent [19]

Price

[11] Patent Number: 4,623,800

[45] Date of Patent: Nov. 18, 1986

[54] CLOCK CONTROLLED DUAL SLOPE VOLTAGE TO FREQUENCY CONVERTER

[75] Inventor: Timothy D. Price, Bognor Regis, England

[73] Assignee: Rosemount Engineering Company Limited, England

[21] Appl. No.: 815,302

[22] Filed: Dec. 27, 1985

Related U.S. Application Data

[63] Continuation of Ser. No. 472,868, Mar. 3, 1983.

[30] Foreign Application Priority Data

Mar. 17, 1982 [GB] United Kingdom ........... 8207796

[51] Int. Cl.$^4$ .................. H03K 5/00; H03K 5/153; H01P 3/08
[52] U.S. Cl. .................. 307/261; 307/362; 307/263; 307/267; 307/271; 307/519; 307/269; 328/127; 328/150
[58] Field of Search ........... 307/261, 263, 266, 267, 307/269, 271, 360, 362, 519, 526, 494, 228, 240; 328/127, 128, 140, 150; 340/347 NT

[56] References Cited

U.S. PATENT DOCUMENTS

| | | | |
|---|---|---|---|
| 3,566,283 | 2/1971 | Diebler | 328/150 |
| 3,731,072 | 5/1973 | Johnston | 235/151.3 |
| 3,749,942 | 7/1973 | Moses | 307/271 |
| 3,778,784 | 12/1973 | Szabo et al. | 340/174.1 A |
| 3,835,402 | 9/1974 | Kublick | 328/181 |
| 3,950,989 | 4/1976 | Meirowitz | 307/271 |
| 4,031,532 | 6/1977 | First | 340/347 NT |
| 4,047,056 | 9/1977 | Nakagawa | 307/271 |
| 4,256,983 | 3/1981 | Griffith et al. | 307/271 |
| 4,410,812 | 10/1983 | Hönig et al. | 307/350 |

FOREIGN PATENT DOCUMENTS

2066626 7/1981 United Kingdom .

OTHER PUBLICATIONS

T. M. Technisches Messen, vol. 48, No. 718, Jul./Aug. 1981 Munchen (DE) G. Meyer: "Ein praziser Stromfrequenz-Umformer nach dem Ladungsbilanzverfahren", pp. 249-256.

Electronik, vol. 23, No. 6, 1974 Munchen (DE) J. Kuhlwetter: "Einfacher, hoch-genauer Spannungs-Frequenz-Umsetzer", pp. 219-220.

Radio Fernsehen Electronik, vol. 26, No. 15, Aug. 1988, Berlin (DD) M. Seifart et al.: "Spannungs-und-Stromfrequenzwandler nach dem Integrationsverfahren", pp. 507-510.

Messen + Prufen/Automatik, No. ½, Jan./Feb. 1979 Woerishoffen (DE) A. Haug: "Widerstands-Frequenz-Umsetzer nach der Ladungs-Bilanzmethode", pp. 65-67.

Primary Examiner—Stanley D. Miller
Assistant Examiner—Richard Roseen
Attorney, Agent, or Firm—Kinney & Lange

[57] ABSTRACT

Clock-controlled dual slope voltage to frequency converter has an integrator supplying a charging ramp to a threshold detector. The slope of the ramp depends on the input voltage to the integrator and the threshold detector is triggered by the ramp to enable a pulse from a clock to generate a constant current discharge pulse. The discharge pulse is fed to the integrator to produce a discharge ramp back below the threshold. The frequency output is taken from the output of the threshold detector to be synchronous with triggering of the detector.

20 Claims, 13 Drawing Figures

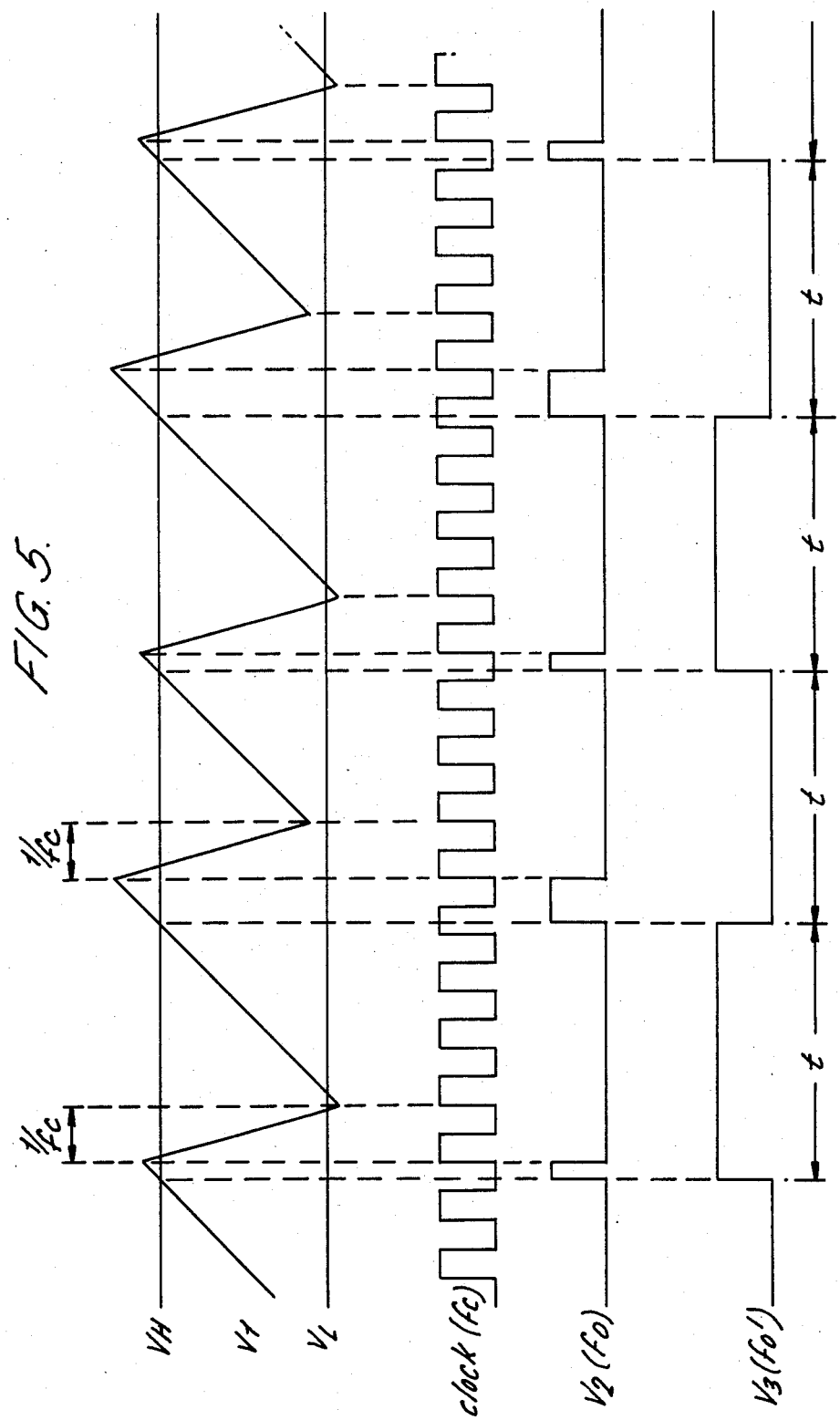

CLOCK CONTROLLED DUAL SLOPE VOLTAGE TO FREQUENCY CONVERTER

This application is a continuation of my copending U.S. application Ser. No. 06/472,868 filed Mar. 3, 1983 for Clock Controlled Dual Slope Voltage to Frequency Converter.

BACKGROUND OF THE INVENTION

The present invention relates to clock controlled dual slope voltage to frequency converters. Various types of voltage to frequency converters are known and a useful summary of the various kinds is published in "Designing With Operational Amplifiers—Application Alternatives", 1977, Burr-Brown Research Corporation, Chapter 8.2 (pages 212-223). The highest precision form of converter as discussed in the above publication is the clock controlled converter which uses a precision clock signal to determine the duration of the constant current discharge pulse applied to the integrator circuit to provide dual slope operation. The problem with such clock controlled converters is that the frequency output signal of the converter is always a subharmonic of the clock frequency, although the average of the output signal frequency is the desired output frequency. As a result, although such converters can have high precision, they have an inherent delay resulting from the need to average the frequency of the output signal. An example of such a converter is shown in U.K. Patent Application Publication No. 2066626.

The present invention provides a converter which obtains the benefits of clock controlled operation whilst providing directly an output frequency which is not phase related to the clock frequency so that frequency averaging is not required.

SUMMARY OF THE INVENTION

According to the present invention there is provided a clock controlled dual slope voltage to frequency converter comprising an input terminal for an input voltage to the converter, an integrator connected to said input terminal to provide an output signal having a charging slope dependent on said input voltage, a clock pulse source, comparator means arranged to provide an output indication in response to each occasion the output signal of the integrator exceeds a predetermined threshold level during charging, discharge pulse generating means arranged to supply, following said output indication, a constant current discharge pulse to the integrator having a constant pulse duration determined by clock pulses from the clock pulse source, whereby the output signal of the integrator has a discharging slope and falls below said predetermined threshold level during each said discharge pulse, frequency signal output means including at least one output terminal of the converter and connected to the output of the comparator means to provide a frequency signal on the output terminal synchronised with the output indications of the comparator means, or a respective said synchronised frequency signal on each output terminal.

With this arrangement, an output frequency signal is generated which is not phase related to the clock frequency, but synchronised with the successive occasions on which the integrator charging slope exceeds the threshold level of the comparator. Between each such occasion, a constant current and duration discharge pulse is applied to the integrator to produce the discharge slope providing dual slope operation. It can be seen that, with a constant input voltage signal, the periods between successive such occasions providing an output indication from the comparator, are constant. Thus, the output frequency signal of the converter, has a constant frequency which is not phase related to the clock frequency. Nevertheless, the discharge pulses are accurately defined in duration by the clock pulses.

Normally, the comparator means provides a pulse as each said output indication, and thus the frequency signal output means may include simply an electrical connection from the output of the comparator means to the output terminal, or one of the output terminals, so that said frequency signal on said terminal is constituted by the successive output pulses of the comparator means. Normally, the comparator means operates to initiate a pulse as each said output indication, i.e. the output state of the comparator means switches over as the integrator output exceeds the threshold. However, the duration of the pulses from the comparator means are not normally constant depending on the mechanism for switching the comparator means back again. Preferably, therefore, the frequency signal output means includes a flip-flop clocked by said successive output pulses of the comparator means to switch between its output states in response to the initiations of said output pulses, the flip-flop having its output connected to the output terminal or one of the output terminals to provide said frequency signal on said output terminal. Then, the frequency signal comprises a unity mark/space ratio wave form at a frequency equal to half the comparator output pulse rate.

Where it is desirable to employ as the output frequency signal, a signal at the same frequency as the comparator output pulses, the frequency signal output means may include pulse stretching means to feed to the output terminal pulses initiated with the initiation of said pulses from the comparator means and having durations between a minimum of one clock period and a maximum of two clock periods.

Conveniently, the comparator means comprises a Schmitt trigger circuit having a predetermined hysteresis between switching thresholds, one said threshold providing said predetermined threshold level. With this arrangement, it is important that the discharge slope of the integrator output signal brings the integrator output below the other said threshold of the Schmitt trigger to ensure that the trigger circuit switches back prior to the next charging slope. This can provide a limitation on the dynamic range of the converter.

To improve the dynamic range, the converter may include a mode switch arranged to connect the integrator output signal to the Schmitt trigger circuit during each said charging slope and to connect a source of voltage beyond the other of said Schmitt thresholds to the Schmitt trigger circuit during each said discharge pulse to ensure return switching of the Schmitt trigger circuit ready for the next charging slope.

The integrator may comprise an operational amplifier having the input voltage fed to its non-inverting input, a capacitor interconnecting the output of the amplifier and its inverting input, a resistor connected to the inverting input and a switch arranged to connect the resistor in series selectively to one of two different reference voltage sources, the discharge pulse generating means controlling the switch to connect the resistor alternately to one reference voltage source to effect the charging slope of the integrator output signal and to the other said source for said constant duration to provide each said discharge pulse. An operational amplifier can also be arranged to provide an inverting integrator by connecting the capacitor and resistor of the non-inverting arrangement described above instead to the inverting input of the amplifier, the non-inverting input then being connected to ground. Then the input voltage to the integrator is also fed via a further series resistor to the inverting input. A drawback of this inverting arrangement of an operational amplifier integrator is that the output signal is dependent on any variation in the values of the two resistors arising, for example, from temperature drift.

On the other hand, the non-inverting arrangement of an operational amplifier integrator has the drawback that the output signal includes a term proportional to the input voltage signal. This may not be important for input voltages which are very small compared to the output swing of the integrator. However, said comparator means may be arranged to be responsive directly to the input voltage to the non-inverting input of the amplifier to cancel out the effect of the component of the integrator output signal which is proportional to the input voltage.

The present invention also envisages a clock controlled frequency to voltage converter having an input terminal for an input frequency signal to the coverter comprising a train of pulses at said input frequency, a clock pulse source, control pulse generating means arranged to produce a control pulse of constant duration determined by clock pulses from the clock pulse source, following the first pulse of said input train since the preceding control pulse, and integrating means including a capacitor, a resistor and a switch controlled by the control pulses to switch the capacitor via the resistor alternately between a reference voltage and ground, whereby the voltage across the capacitor is the reference voltage proportioned in accordance with the mark/space ratio of said control pulses. With this arrangement, each pulse of the input frequency signal produces a control pulse at a time and having a duration determined by the clock pulses. It can be seen that the maximum input frequency is equal to half the clock pulse frequency. With some arrangements of this frequency to voltage converter, input frequencies in excess of the above maximum frequency may cause the output voltage across the capacitor to fall below the maximum voltage corresponding to an input frequency equal to half of the clock frequency. It can be seen that normally each said control pulse has a duration equal to a single pulse period of the clock pulses and the maximum rate of said control pulses is half the clock pulse rate. In order to ensure that the output voltage of the converter is constant for all input frequencies in excess of the maximum, said control pulse generating means may be arranged to produce a subsequent control pulse in response to one or more pulses of said input train received during the preceding control pulse.

Examples of the present invention will now be described with reference to the accompanying drawings.

BRIEF DESCRIPTION OF THE DRAWINGS

FIG. 5 is a timing diagram illustrating the operation of the modified circuit of FIG. 4;

DETAILED DESCRIPTION OF THE PREFERRED EMBODIMENTS

Figure 1:
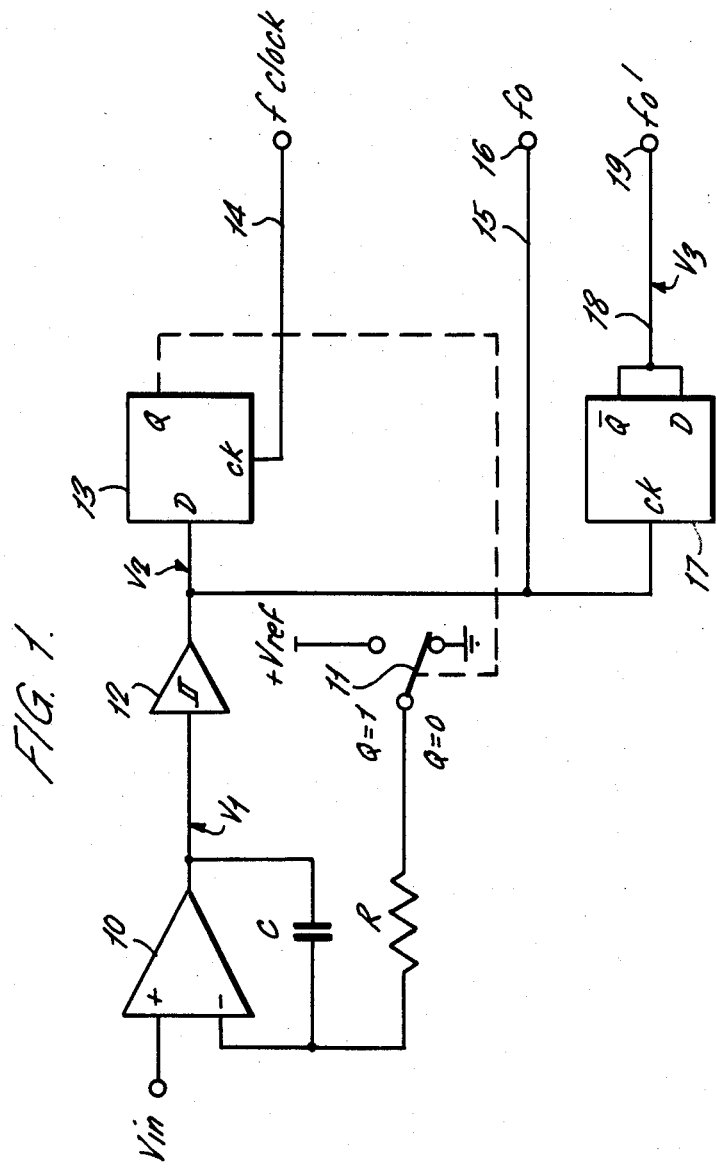
FIG. 1 is a block schematic diagram of a voltage to frequency converter embodying the present invention.

Referring to FIG. 1, an input voltage signal Vin is applied to the non-inverting input of an operational amplifier 10 connected as an integrator. A capacitor C is connected between the output of the amplifier 10 and the inverting input and a resistor R is connected from the inverting input to ground via a switch 11. It will be appreciated that with this circuit arrangement and with the switch 11 connecting the resistor R to ground as shown in FIG. 1, the output signal $V_1$ from the amplifier 10 comprises a positive going ramp having a slope proportional to Vin.

The integrator output signal from the amplifier 10 is fed to a Schmitt trigger 12. The output signal from the Schmitt trigger switches to the "high" state as the integrator output exceeds the upper threshold voltage of the Schmitt. The Schmitt output $V_2$ is fed to the D input of a D-type flip-flop 13 which is clocked by a precision clock signal on a line 14. The D-type flip-flop 13 operates so that its Q output switches to a logic "1" on the first clock pulse after the signal on its D input goes high. The Q output of the flip-flop 13 is used to control the switch 11 to operate the switch to connect the resistor R to a source of reference voltage Vref so long as the Q output is at a logic "1".

When the resistor R is connected to the reference voltage Vref, the output of the amplifier 10 ramps downwards with a downward slope dependent on the relative values of Vref and Vin. This dual slope operation of the integrator is established in the art. The Q output of the flip-flop 13 remains at a logic "1" until the immediately following clock pulse whereupon it reverts to a logic "0". Thus, it can be seen that the switch 11 is switched to the reference voltage for a precise period of time corresponding to one clock pulse period. Thus, the discharge pulse applied to the integrator to produce the down ramp has an accurately defined duration determined by the precision of the clock pulses supplied on line 14.

Figure 2:
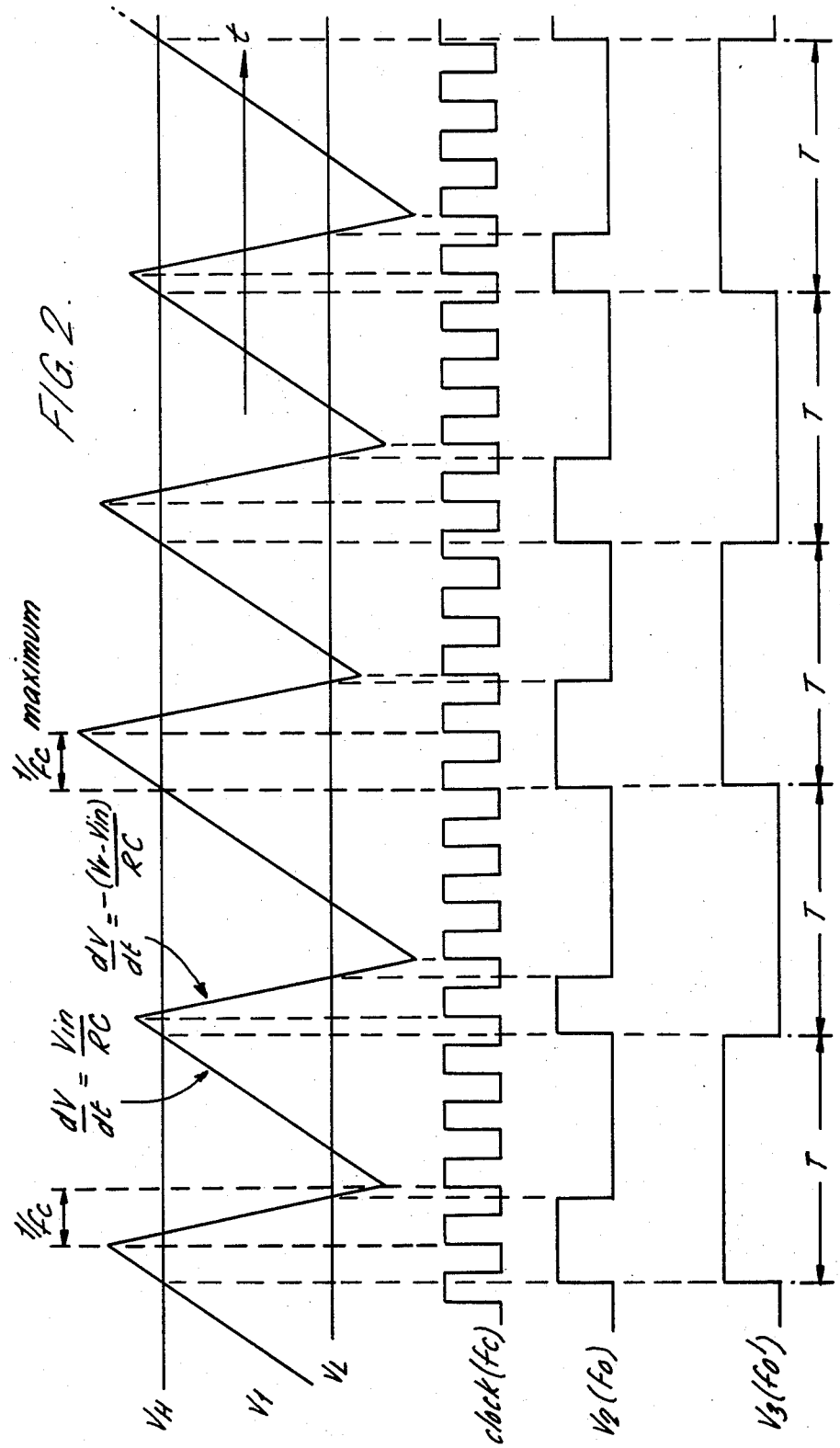
FIG. 2 is a timing diagram illustrating the operation of the circuit of FIG. 1.

Referring to FIG. 2, the sequential operation of the circuit as the output signal of the amplifier 10 repeatedly exceeds an upper threshold $V_H$ of the Schmitt trigger 12 is illustrated. The uppermost wave form in FIG. 2 shows the output $V_1$ of the amplifier 10. During the positive going slope of the output, the charging slope, $V_1$ increases at the rate Vin/RC. On the other hand the negative going slope of the amplifier output during the discharge pulses when the switch 11 is connected to Vref (Vr), is $$-\frac{(Vr - Vin)}{RC}.$$

If the clock frequency is $f_c$, the down slope of $V_1$ has a duration accurately defined as $1/f_c$. Thus the voltage drop of $V_1$ during each down slope is equal to $$\frac{Vr - Vin}{RC} \times \frac{1}{f_c}.$$

On the other hand, if the total time during which $V_1$ is increasing between successive transitions of upper threshold $V_H$ is taken to be t, then the total increase in voltage between successive threshold transitions equals $$t \times \frac{Vin}{RC},$$

which is equal to $$\frac{Vr - Vin}{RC} \times \frac{1}{f_c},$$

in order to provide a continuous wave form.

Thus, $$t = \frac{Vr - Vin}{Vin} \times \frac{1}{f_c}.$$

Therefore, the total period between successive transitions of the upper threshold $V_H$ is $$T = t + \frac{1}{f_c} = \frac{1}{f_c} \times \frac{Vr}{Vin}.$$

It is apparent therefore that the threshold crossings are accurately periodic and are not related in phase to the clock frequency $f_c$.

The third wave form shown in FIG. 2 is the output signal $V_2$ of the Schmitt trigger 12. The output signal switches to a high state as $V_1$ exceeds the upper threshold $V_H$ of the Schmitt trigger and returns to a low state when $V_1$ crosses a lower switching threshold $V_L$ of the Schmitt during the downward slope. The hysteresis between $V_H$ and $V_L$ is normal for Schmitt trigger circuits and is useful in eliminating the jitter that can be experienced with an ordinary comparator resulting from noise on the ramp signal $V_1$. Such jitter could produce errors by causing erroneous clocking of the flip-flop 13.

It can be seen therefore that the leading edges of the pulses produced by the Schmitt trigger 12 ($V_2$) are at a frequency $f_0$ equal to $$f_c \times \frac{Vin}{Vr}.$$

$f_0$ is in no way phase related with the clock frequency $f_c$. The output of the Schmitt trigger 12 is supplied, in the example of FIG. 1, on a line 15 to an output terminal 16 for use as the frequency signal output of the converter.

It can be seen however that the duration of the pulses of $V_2$ are not constant. Desirably, therefore, the voltage $V_2$ is supplied as the clock input to a toggle flip-flop 17 producing an output signal $V_3$ on a line 18 to a second output terminal 19. The wave form of $V_3$ is shown in FIG. 2 and has a frequency $f_0'$ equal to $f_0/2$. However, $V_3$ has a unity mark/space ratio as illustrated.

The advantages of the voltage to frequency converter shown in FIG. 1 include the following:

1. The output frequency is independent, rather than a sub-harmonic of the clock.

2. The output frequency is dynamically correct, settling within a cycle or so, and thus no averaging need take place.

3. The individual period of the output signal is accurate, as is the time between one output transition and the next.

4. Accuracy of the converter, neglecting offset voltages and currents in the integrator amplifier 10, is dependent on the accuracy of the reference voltage Vr (which can be derived from a highly stable band gap reference source); the precision of the clock period and frequency, which can be based on a crystal oscillator giving great accuracy and stability.

In another arrangement, the output frequency $f_0'$ can be counted over a period of time also determined by the clock frequency $f_c$, thereby giving a direct digital output in which any clock instability cancels out.

It can be seen that the down ramp of $V_1$ must pass the lower threshold voltage $V_L$ of the Schmitt 12 in the time $1/f_c$ to avoid errors. This provides a limitation on the dynamic range of the converter:

$$Vin < \frac{Vr - RC \cdot f_c \cdot VH}{2},$$

where VH is the maximum hysteresis voltage of the Schmitt trigger between switching thresholds.

Figure 3:
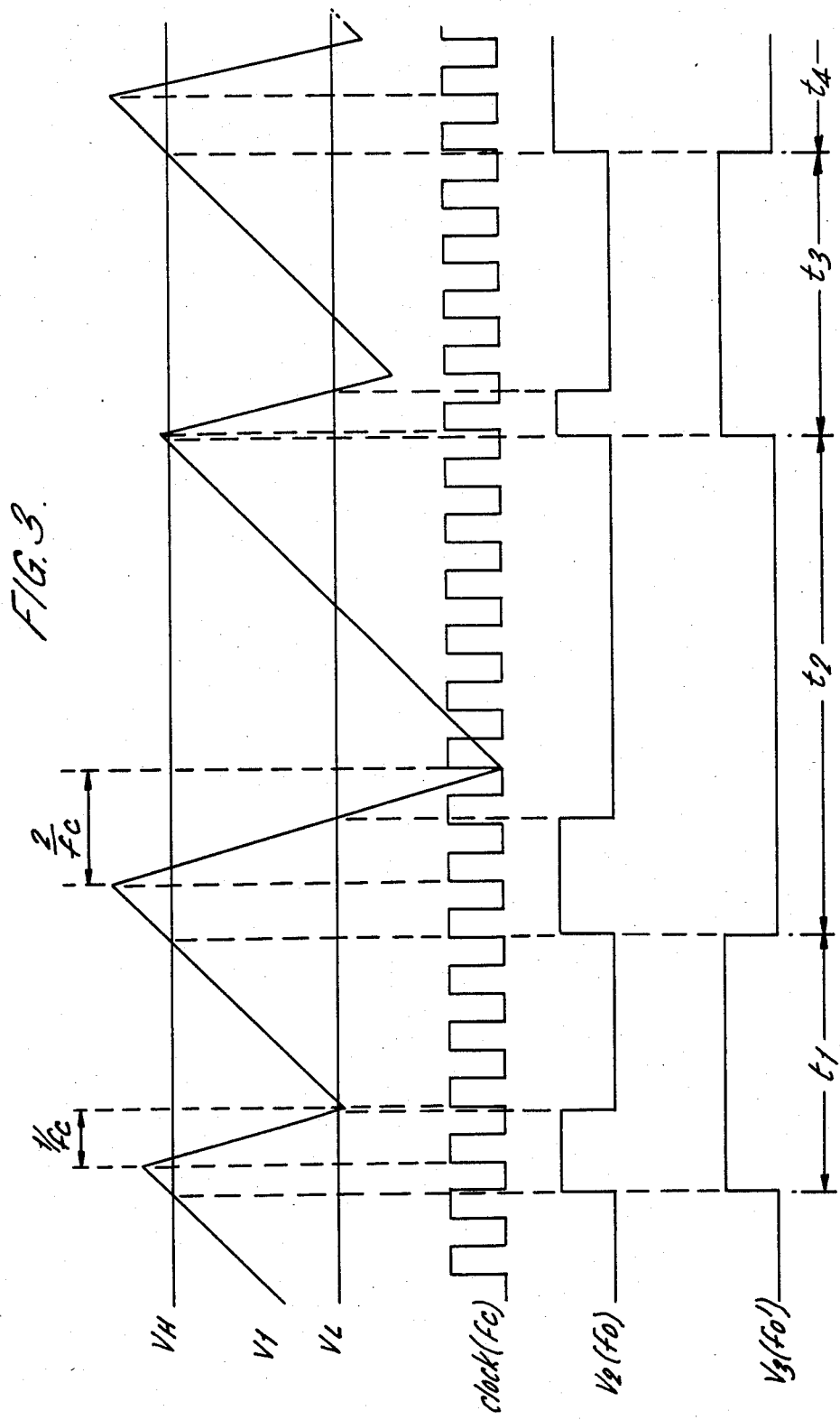
FIG. 3 is a further timing diagram illustrating how the converter of FIG. 1 can miss output pulses for input voltages in excess of a predetermined maximum.

FIG. 3 is a timing diagram illustrating what happens if Vin exceeds the above limitation. On some occasions, the down ramp of $V_1$ does not reach the lower threshold $V_L$ in the time $1/f_c$ so that the D input to the flip-flop 13 is still high for the next clock pulse on line 14 causing the Q output of the flip-flop to remain at a logic "1". Thus, the down ramp of $V_1$ continues for a second clock period with the result that the period between successive transitions of $V_1$ with the upper threshold $V_H$ do not remain constant.

The hysteresis of the Schmitt trigger is desirable in providing some noise immunity as explained previously. However, one method of reducing the dynamic range limitation mentioned above is to minimize this hysteresis.

Figure 4:
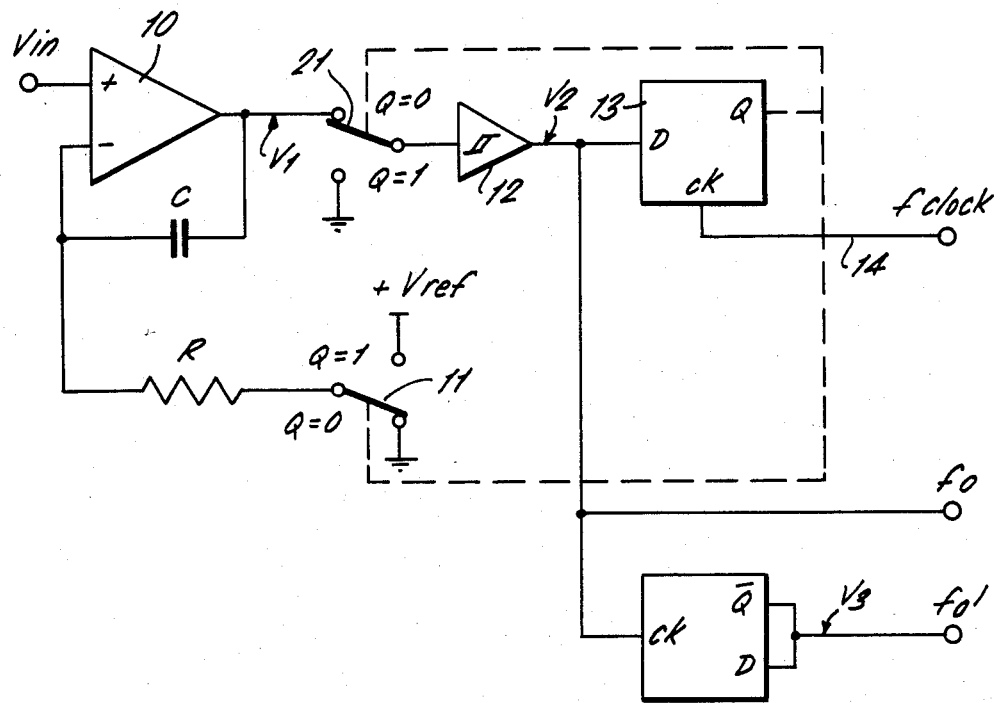
FIG. 4 is a block schematic diagram illustrating a modification of the circuit of FIG. 1 which increases the dynamic range of the circuit.

Alternatively, the effect of the hysteresis band can be removed logically by a modification to the circuitry as illustrated in FIG. 4. A mode change switch 21 is included between the output of the integrator 10 and the Schmitt trigger 12. The switch 21 is arranged to connect the output of the amplifier 10 to the Schmitt trigger 12 only when the Q output of the flip-flop 13 is at a logic "0", and to connect the input of the trigger 12 to ground when the Q output of the flip-flop 13 is at a logic "1". The effect of this modification is as illustrated in FIG. 5 which shows that the Schmitt trigger 12 is forced to revert to a low output state as soon as the next clock pulse on line 14 toggles the flip-flop 13 causing the Q output to go to logic "1". This ensures that the Q output remains at a logic "1" only for one clock period even if the down ramp of the integrator output has not reached the lower switching threshold of the Schmitt 12.

With this modification, it can be seen that the output frequency $f_O$ of the converter cleanly limits at $$\frac{f_c}{2}\left(f_0' < \frac{f_c}{4}\right).$$

Thus, the dynamic range limitation is $$V_{in} < \frac{V_r}{2}.$$

Figure 6:
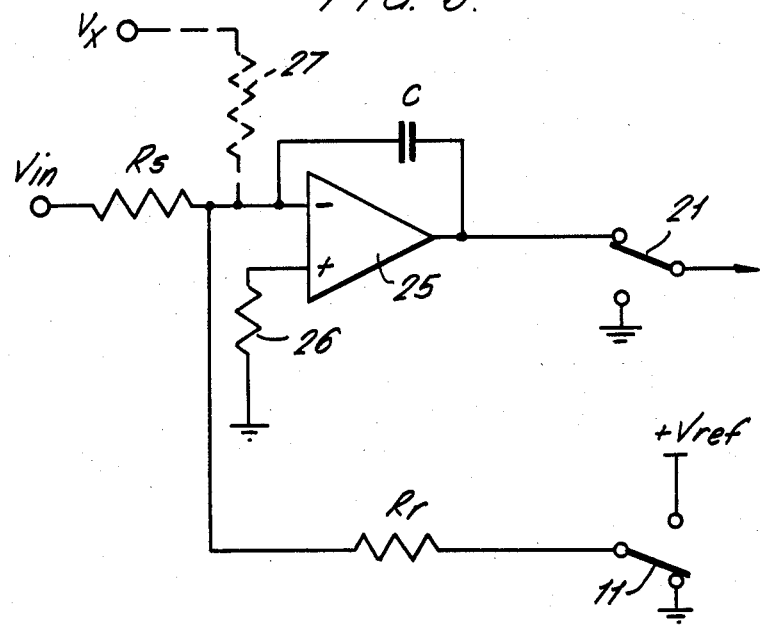
FIG. 6 is a schematic circuit diagram of an inverting summing integrator as an alternative to the non-inverting integrator shown in FIGS. 1 and 4.

A further ranging improvement to the converter may be provided by implementing the integrator as an inverting summing integrator as illustrated in FIG. 6. In this arrangement an amplifier 25 has its non-inverting input connected to ground via a resistor 26. The input voltage to the converter is supplied to the inverting input via a series resistor $R_s$. Capacitor C is connected between the output of the amplifier and the inverting input and the inverting input is also connected via a series resistance $R_r$ to the switch 11 which operates in the same manner as the circuits of FIGS. 1 and 4. The output of the amplifier 25 is supplied to a Schmitt trigger via a mode change switch 21 as before.

It can then be shown that the output frequency of the converter $$f_0' = \frac{V_{in}}{V_r} \times \frac{f_c}{2} \times \frac{R_s}{R_r}.$$

Input voltage flexibility is thereby enhanced, albeit at the expense of two extra components in the circuit. Further the transfer equation of the converter is degraded by inaccuracies and temperature drift resulting from the factor $R_s/R_r$. It should be noted also that the input signal must now be of opposite polarity.

The circuit of FIG. 6 can readily be modified to accommodate a bi-polarity input voltage range. Then, a further reference voltage $V_x$ is connected to the inverting input via a further resistor 27 to provide a desired offset bias to the integrator.

Although the non-inverting integrator arrangement, as shown in FIGS. 1 and 4, is desirable in avoiding errors arising from temperature drift and inaccuracies in the resistors used for the inverting type integrator, the non-inverting type has the disadvantage that its output signal includes a factor directly proportional to the input voltage. Thus, the output voltage of the non-inverting integrator is equal to $$V_{in} + \frac{1}{RC} \int V_{in}\, dt.$$

In many cases, since the factor 1/RC is much greater than 1, the influence of the $V_{in}$ term in the output of the integrator is insignificant. However, when this is not the case, the effect of the term can be compensated for.

Figure 7A:
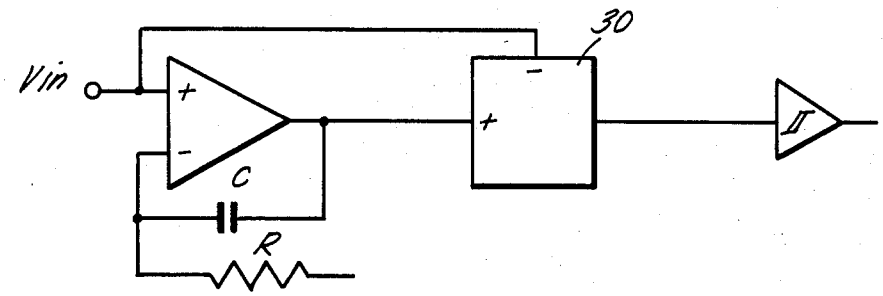
FIGS. 7a and 7b are block schematic diagrams of alternative modifications to correct for errors in the output signal using a non-inverting integrator.
Figure 7B:
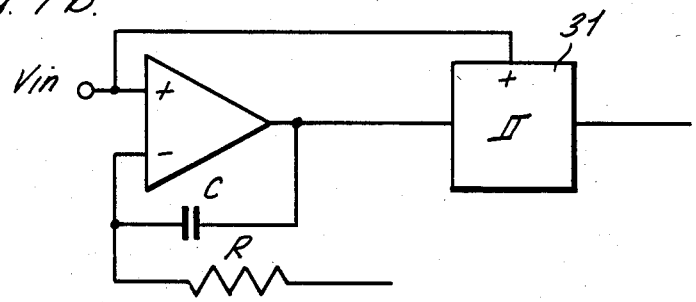

FIGS. 7a and 7b illustrate two arrangements for compensating non-inverting integrators. In FIG. 7a, the input voltage to the integrator is fed forward to a unity gain amplifier 30 connected as an analogue subtractor. The amplifier 30, subtracts Vin from the output of the integrator to produce a compensated output fed to the Schmitt trigger in the usual way.

In FIG. 7b, there is illustrated an arrangement using a Schmitt trigger 31 which has an externally variable upper threshold. In this arrangement, the input voltage to the integrator is fed forward to the Schmitt trigger 31 to control the upper threshold again to compensate for the Vin term in the integrator output.

Figure 8:
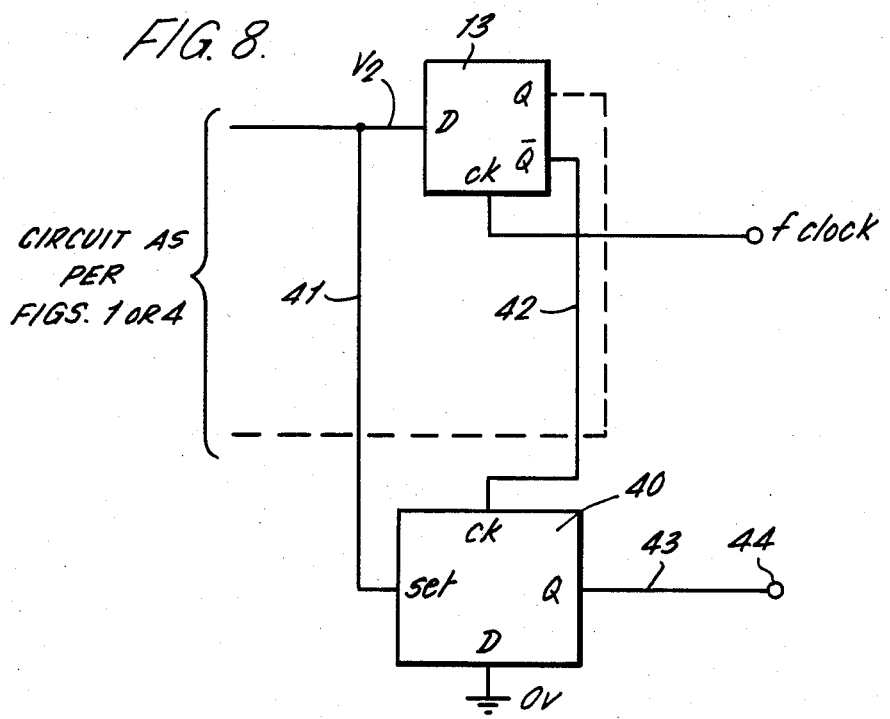
FIG. 8 is a block schematic diagram illustrating a pulse stretching arrangement to increase the minimum length of output pulses from the converter of FIGS. 1 or 4.

As mentioned above, an output $f_0'$ of the converter can have a unit mark/space ratio. However, in some arrangements, it may be necessary to employ the output $f_O$ in which the pulses are of varying duration. It may then be desirable to ensure that the pulses of the $f_O$ signal have a predetermined minimum duration, i.e. that the pulses are stretched if necessary. FIG. 8 illustrates an appropriate circuit for stretching the pulses in the signal $V_2$. The output of the Schmitt trigger $V_2$ is then supplied on a line 41 to the SET input of a flip-flop 40 so that the Q output of the flip-flop is set to a logic "1" as soon as the Schmitt output goes high. The flip-flop 40 is reset by a signal applied to its clock input on a line 42 from the $\overline{Q}$ output of the flip-flop 13, so that the Q output of the flip-flop 40 remains at a logic "1" until after the discharge pulse applied to the integrator amplifier 10 as determined by the flip-flop 13. In this way, the output pulses from the flip-flop 40 on line 43 supplied to an output terminal 44 have a minimum duration equal to $1/f_c$ and a maximum duration equal to $2/f_c$.

Figure 9:
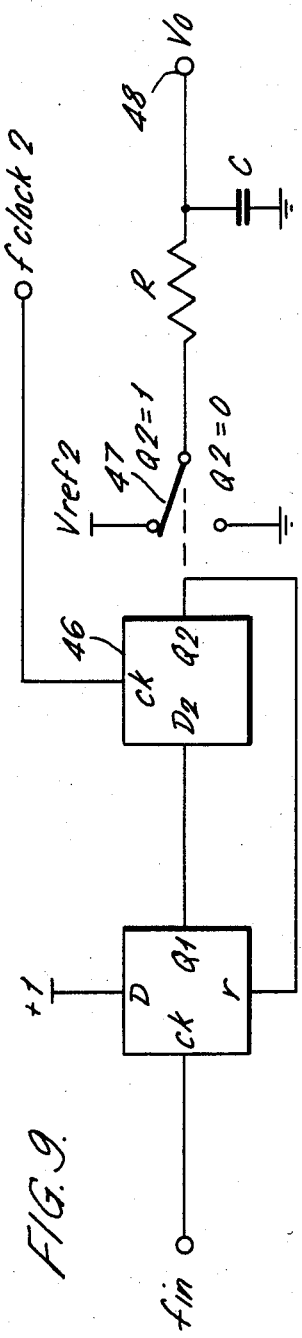
FIG. 9 is a block schematic diagram illustrating a frequency to voltage converter embodying the present invention.
Figure 10:
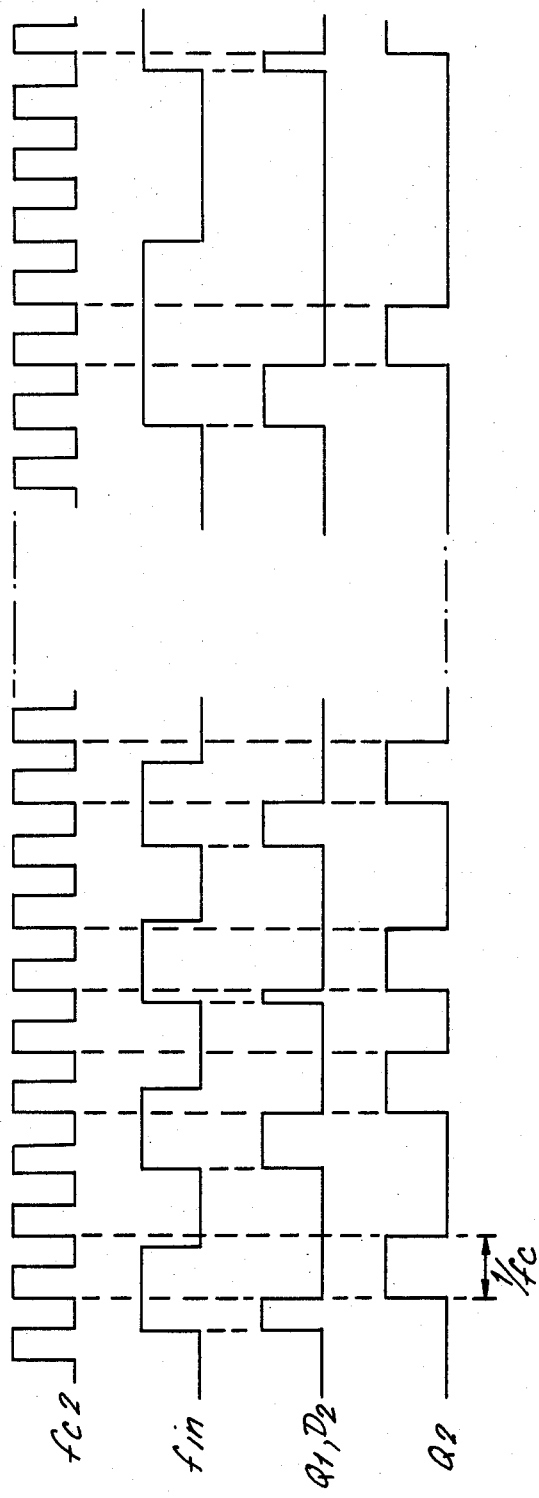
FIG. 10 is a timing diagram illustrating the operation of the frequency to voltage converter of FIG. 9 with two different input frequencies.

FIG. 9 illustrates a frequency to voltage converter which can resynchronise an unsynchronised input frequency signal $f_{in}$ with a local precision clock signal $f_{c2}$. FIG. 10 shows a timing diagram illustrating the operation of this converter of FIG. 9 at two different input frequencies $f_{in}$. The pulse output signal from output $Q_2$ of a flip-flop 46 can be seen to have a duration $1/f_{c2}$ and t occur once per $1/f_{in}$. The limitation is that $f_{in}$ is not greater than $f_c/2$. This limit applies because it takes two clock periods to process each $f_{in}$ pulse. The averaging network including resistor capacitor RC and switch 47 produces an average output $V_0$ on terminal 48 equal to $$f_{in} \times \frac{V_{r2}}{f_c}.$$

Figure 11:
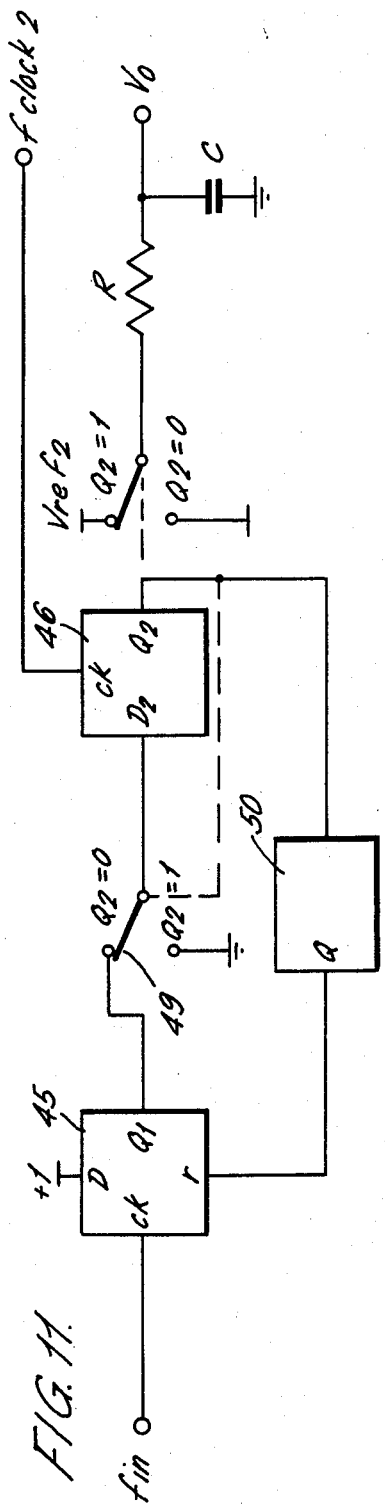
FIG. 11 is a block schematic diagram illustrating a modified version of the frequency to voltage converter of FIG. 9.
Figure 12:
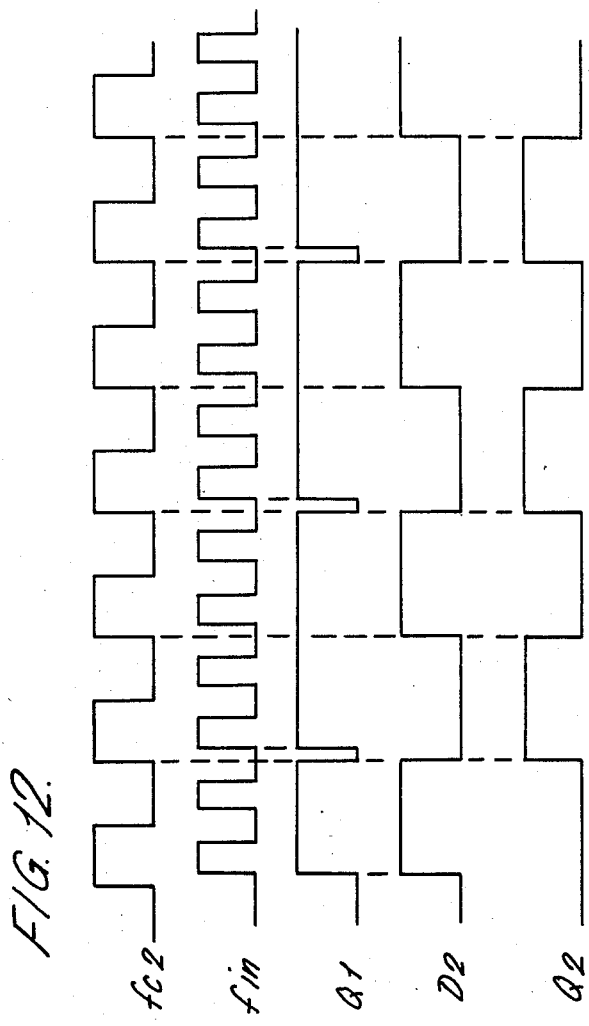
FIG. 12 is a timing diagram illustrating the operation of the converter of FIG. 11.

In the arrangement illustrated in FIG. 9, when $f_{in}$ exceeds $f_c/2$, the system starts to miss input pulses and the response of the converter thus appears to be re-entrant. A solution is illustrated in FIG. 11 which includes a positive edge input monostable 50 connecting the $Q_2$ output of flip-flop 46 to the reset terminal of flip-flop 45. This permits the flip-flop 45 to be reset promptly after the rising edge of pulses from $Q_2$ of the flip-flop 46. This is illustrated in the timing diagram shown in FIG. 12. Thus, flip-flop 45 can now respond to $f_{in}$ pulses even whilst $Q_2$ is high.

A mode change switch 49 interconnects the $Q_1$ output of flip-flop 45 to the $D_2$ input of flip-flop 46. The mode change switch 49 is arranged to connect $Q_1$ to $D_2$ when $Q_2$ is at a logic "0", and to connect $D_2$ to ground when $Q_2$ is a logic "1". Thus, flip-flop 46 is forced to toggle if the pulse rate on $f_{in}$ is high on each rising edge of the clock pulse $f_{c2}$.

The result of these modifications is to ensure that the converter cleanly limits $$V_0 \text{ to } \frac{V_{r2}}{2}$$

for input conditions of $$f_{in} > \frac{f_c}{2}.$$

It can be seen that the voltage to frequency converter illustrated and described above and the above mentioned frequency to voltage converter may be used together, assuming the $f_0$ output of the voltage to frequency converter, such that where $$V_0 = V_{in} \cdot k$$

$$\text{where } k = \frac{f_{c1}}{f_{c2}} \times \frac{V_{r2}}{V_{r1}}.$$

A further advantage of the frequency to voltage converter of FIG. 9 is that a divider can be included in the clock line to flip-flop 46 effectively to provide digital gain. Thus, $$V_0 = f_{in} \times \frac{V_{r2}}{f_{c2}} \times n,$$

where n is the divisor on $f_{c2}$.

What is claimed is:

1. Clock-controlled dual slope voltage to frequency converter comprising, an input terminal to provide an input voltage to the converter, an integrator connected to said input terminal to provide an output signal having a charging slope dependent on said input voltage, a clock pulse source, comparator means providing an output indication in response to and in synchronism with each occasion the output signal of the integrator exceeds a predetermined threshold level during charging, discharge pulse generating means connected to an output terminal of the comparator means and to the clock pulse source and supplying, following said output indication, a constant current discharge pulse to the integrator having a constant pulse duration determined by clock pulses from the clock pulse source, whereby the output signal of the integrator has a discharging slope and falls below said predetermined threshold level during each said constant current discharge pulse, and frequency signal output means including at least one output terminal of the converter and connected to the output terminal of the comparator means to provide a frequency signal on said at least one output terminal of the converter synchronized with the output indications of the comparator means, the comparator means providing an output pulse as each said output indication and the frequency signal output means including an electrical connection from the output terminal of the comparator means to said at least one output terminal, so that said frequency signal on said at least one output terminal is constituted by successive said output pulses of the comparator means and is not phase related to the clock frequency.

2. A converter as claimed in claim 1 wherein the comparator means comprises a Schmitt trigger circuit having a predetermined hysteresis between switching thresholds, one of said switching thresholds providing said predetermined threshold level.

3. A converter as claimed in claim 2 and including a mode switch supplying the integrator output signal to the Schmitt trigger circuit during each said charging slope and supplying a source of voltage beyond the other of said switching thresholds to the Schmitt trigger circuit during each said constant current discharge pulse to ensure return switching of the Schmitt trigger circuit ready for next said charging slope.

4. A converter as claimed in claim 1 wherein the integrator comprises an operational amplifier having the input voltage fed to its non-inverting input, a capacitor interconnecting an output of the amplifier and its inverting input, a resistor connected to the inverting input and a switch connecting the resistor in series selectively to one of two different reference voltage sources, the discharge pulse generating means controlling the switch to connect the resistor alternately to one reference voltage source to effect the charging slope of the integrator output signal and to another reference voltage source for a duration equal to said constant pulse duration of said constant current discharge pulse.

5. A converter as claimed in claim 4 wherein said comparator means is responsive directly to the input voltage of the non-inverting input of the amplifier to cancel out the effect of the component of the integrator output signal which is proportional to the input voltage.

6. Clock-controlled dual slope voltage to frequency converter comprising, an input terminal to provide an input voltage to the converter, an integrator connected to said input terminal to provide an output signal having a charging slope dependent on said input voltage, a clock pulse source, comparator means providing an output indication in response to each occasion the output signal of the integrator exceeds a predetermined threshold level during charging, discharge pulse generating means connected to an output terminal of the comparator means and to the clock pulse source and supplying, following said output indication, a constant current discharge pulse to the integrator having a constant pulse duration determined by clock pulses from the clock pulse source, whereby the output signal of the integrator has a discharging slope and falls below said predetermined threshold level during each said constant current discharge pulse, and frequency signal output means including at least one output terminal of the converter and connected to the output terminal of the comparator means to provide a frequency signal on said at least one output terminal of the converter synchronized with the output indications of the comparator means, the comparator means initiating an output pulse as each said output indication, durations of the output pulses of the comparator means being non-constant, and the frequency signal output means including a flip-flop clocked by successive said output pulses of the comparator means to switch between output states in response to the initiations of said output pulses of the comparator means, the flip-flop having its output connected to said at least one output terminal of the converter to provide said frequency signal on said at least one output terminal of the converter.

7. Clock-controlled dual slope voltage to frequency converter comprising, an input terminal to provide an input voltage to the converter, an integrator connected to said input terminal to provide an output signal having a charging slope dependent on said input voltage, a clock pulse source, comparator means providing an output indication in response to each occasion the output signal of the integrator exceeds a predetermined threshold level during charging, discharge pulse generating means connected to an output terminal of the comparator means and to the clock pulse source and supplying, following said output indication, a constant current discharge pulse to the integrator having a constant pulse duration determined by clock pulses from the clock pulse source, whereby the output signal of the integrator has a discharging slope and falls below said predetermined threshold level during each said constant current discharge pulse, and frequency signal output means including at least one output terminal of the converter and connected to the output terminal of the comparator means to provide a frequency signal on said at least one output terminal of the converter synchronized with the output indications of the comparator means, the comparator means initiating an output pulse as each said output indication, durations of the output pulses being non-constant, and the frequency signal output means including pulse stretching means connected to the output terminal of the comparator means and to said discharge pulse generating means for receiving said constant current discharge pulses and for feeding said at least one output terminal of the converter with pulses initiated with initiation of said output pulses from the comparator means and having durations between a minimum of one clock period and a maximum of two clock periods.

8. A converter as claimed in claim 6 wherein the comparator means comprises a Schmitt trigger circuit having a predetermined hysteresis between switching thresholds, one of said switching thresholds providing said predetermined threshold level.

9. A converter as claimed in claim 8 and including a mode switch supplying the integrator output signal to the Schmitt trigger circuit during each said charging slope and a source of voltage beyond another of said switching thresholds of the Schmitt trigger circut during each said constant current discharge pulse to ensure return switching of the Schmitt trigger circuit ready for next said charging slope.

10. A converter as claimed in claim 6 wherein the integrator comprises an operational amplifier having the input voltage fed to its non-inverting input, a capacitor interconnecting an output of the amplifier and its inverting input, a resistor connected to the inverting input and a switch connecting the resistor in series selectively to one of two different reference voltage sources, the discharge pulse generating means controlling the switch to connect the resistor alternately to one reference voltage source to effect the charging slope of the integrator output signal and to another reference voltage source for said constant pulse duration to provide each said discharging slope of the integrator.

11. A converter as claimed in claim 10 wherein said comparator means is responsive directly to the input voltage of the non-inverting input of the amplifier to cancel out effects of components of the integrator output signal which are proportional to the input voltage.

12. A converter as claimed in claim 7 wherein the comparator means comprises a Schmitt trigger circuit having a predetermined hysteresis between switching thresholds, one of said switching thresholds providing said predetermined threshold level.

13. A converter as claimed in claim 12 and including a mode switch supplying the integrator output signal to the Schmitt trigger circuit during each said charging slope and a source of voltage beyond a second of said switching thresholds of the Schmitt trigger circuit during each said discharge pulse to ensure return switching of the Schmitt trigger circuit ready for next said charging slope.

14. A converter as claimed in claim 7 wherein the integrator comprises an operational amplifier having the input voltage fed to its non-inverting input, a capacitor interconnecting an output of the amplifier and its inverting input, a resistor connected to the inverting input and a switch connecting the resistor in series selectively to one of two different reference voltage sources, the discharge pulse generating means controlling the switch to connect the resistor alternately to one reference voltage source to effect the charging slope of the integrator output signal and to another reference voltage source for a duration equal to said constant pulse duration of said constant current discharge pulse to provide each said discharging slope of the integrator.

15. A converter as claimed in claim 14 wherein said comparator means is arranged to be responsive directly to the input voltage of the non-inverting input of the amplifier to cancel out effects of components of the integrator output signal which are proportional to the input voltage.

16. Clock controlled dual slope voltage to frequency converter comprising, an input terminal to provide an input voltage to the converter, an integrator connected to said input terminal to provide an output signal having a charging slope dependent on said input voltage, a clock pulse source, comparator means providing an output indication in response to and in synchronism with each occasion the output signal of the integrator exceeds a predetermined threshold level during charging, discharge pulse generating means connected to an output terminal of the comparator means and to the clock pulse source and supplying, following said output indication, a constant current discharge pulse to the integrator having a constant pulse duration determined by clock pulses from the clock pulse source, whereby the output signal of the integrator has a discharging slope and falls below said predetermined threshold level during each said constant current discharge pulse, and frequency signal output means including to least one output terminal of the converter and connected to the output terminal of the comparator means to provide a frequency signal on said at least one output terminal of the converter synchronized with the output indications of the comparator means, the comparator means initiating an output pulse as each said output indication, durations of the output pulses being non-constant, and the frequency signal output terminal of the pulse stretching means connected to the output terminal of the comparator means for feeding to said at least one output terminal of the converter pulses that are stretched to have a predetermined minimum duration.

17. A converter as claimed in claim 16 wherein the comparator means comprises a Schmitt trigger circuit having a predetermined hysteresis between switching thresholds, one of said switching thresholds providing said predetermined threshold level.

18. A converter as claimed in claim 17 and including a mode switch supplying the integrator output signal to the Schmitt trigger circuit during each said charging slope and a source of voltage beyond a second of said switching thresholds of the Schmitt trigger circuit during each said discharge pulse to ensure return switching of the Schmitt trigger circuit ready for next said charging slope.

19. A converter as claimed in claim 16 wherein the integrator comprises an operatonal amplifier having the input voltage fed to its non-inverting input, a capacitor interconnecting an output of the amplifier and its inverting input, a resistor connected to the inverting input and a switch connecting the resistor in series selectively to one of two different reference voltage sources, the discharge pulse generating means controlling the switch to connect the resistor alternately to one reference voltage source to effect the charging slope of the integrator ouptut signal and to another reference voltage source for a duration equal to said constant pulse duration of said constant current discharge pulse to provide each said discharging slope of the integrator.

20. A converter as claimed in claim 19 wherein said comparator means is arranged to be responsive directly to the input voltage of the non-inverting input of the amplifier to cancel out effects of components of the integrator output signal which are proportional to the input voltage.

* * * * *

UNITED STATES PATENT AND TRADEMARK OFFICE
CERTIFICATE OF CORRECTION

PATENT NO. : 4,623,800

DATED : November 18, 1986

INVENTOR(S) : Timothy D. Price

It is certified that error appears in the above-identified patent and that said Letters Patent is hereby corrected as shown below:

Line 55, Column 12, please delete "terminal of the" and insert --means including--.

Signed and Sealed this

Twenty-first Day of April, 1987

Attest:

DONALD J. QUIGG

Attesting Officer

Commissioner of Patents and Trademarks